United States Patent
Seki et al.

(10) Patent No.: US 10,470,300 B1
(45) Date of Patent: Nov. 5, 2019

(54) GLASS PANEL FOR WIRING BOARD AND METHOD OF MANUFACTURING WIRING BOARD

(71) Applicant: AGC Inc., Chiyoda-ku (JP)

(72) Inventors: Toshitake Seki, Aichi (JP); Yutaka Takagi, Aichi (JP); Toshikazu Horio, Aichi (JP); Atsuhiko Sugimoto, Aichi (JP)

(73) Assignee: AGC Inc., Chiyoda-ku (JP)

( * ) Notice: Subject to any disclaimer, the term of this patent is extended or adjusted under 35 U.S.C. 154(b) by 0 days.

(21) Appl. No.: 16/043,982

(22) Filed: Jul. 24, 2018

(51) Int. Cl.
| | |
|---|---|
| *H05K 1/02* | (2006.01) |
| *H05K 1/03* | (2006.01) |
| *H05K 3/00* | (2006.01) |
| *H05K 1/11* | (2006.01) |
| *B32B 17/10* | (2006.01) |

(52) U.S. Cl.
CPC ......... *H05K 1/0269* (2013.01); *H05K 1/0306* (2013.01); *H05K 1/115* (2013.01); *H05K 3/0008* (2013.01); *H05K 3/0094* (2013.01); *B32B 17/10376* (2013.01)

(58) Field of Classification Search
CPC ............... H05K 1/0269; H05K 1/0306; H05K 2201/09936; H05K 2201/09618; H05K 2201/09127; H05K 2201/09918; H05K 2203/162; H05K 2203/166; H05K 2203/167; H05K 3/0097; B32B 3/266; H01L 23/544; H01L 2223/544; H01L 2223/55406; H01L 2223/55413; H01L 2223/5442; H01L 2223/54426; H01L 2223/54433
See application file for complete search history.

(56) References Cited

U.S. PATENT DOCUMENTS

| | | | | |
|---|---|---|---|---|
| 6,607,939 | B2 * | 8/2003 | Pommer | H01L 21/4846 257/E21.525 |
| 2001/0008442 | A1 * | 7/2001 | Miyake | G03F 9/00 355/53 |
| 2003/0086600 | A1 * | 5/2003 | Ganot | G03F 9/00 382/151 |
| 2003/0150839 | A1 * | 8/2003 | Kobayashi | C03C 15/00 216/97 |
| 2012/0168412 | A1 * | 7/2012 | Hooper | B23K 26/70 219/121.69 |
| 2013/0034687 | A1 * | 2/2013 | Koike | C03C 3/091 428/131 |

(Continued)

FOREIGN PATENT DOCUMENTS

JP 2014-93406 5/2014

*Primary Examiner* — Roshn K Varghese
(74) *Attorney, Agent, or Firm* — Oblon, McClelland, Maier & Neustadt, L.L.P.

(57) ABSTRACT

A glass panel for a wiring board, includes a first surface and a second surface, the second surface being opposite to the first surface; and an alignment mark constituted by a plurality of through holes each penetrating the glass panel from the first surface to the second surface, at least one of the plurality of through holes being configured such that a first diameter "t1" of a first opening at the first surface, a second diameter "t2" of a second opening at the second surface, and a minimum diameter "t3" between the first surface and the second surface satisfy t1>t3 and also t2>t3.

32 Claims, 11 Drawing Sheets

(56) References Cited

U.S. PATENT DOCUMENTS

| | | | |
|---|---|---|---|
| 2013/0034688 A1* | 2/2013 | Koike | H01L 23/15 |
| | | | 428/134 |
| 2014/0015121 A1* | 1/2014 | Koizumi | H01L 23/48 |
| | | | 257/734 |
| 2015/0060402 A1* | 3/2015 | Burkett | H05K 1/0306 |
| | | | 216/41 |
| 2015/0257256 A1* | 9/2015 | Sato | H05K 1/0269 |
| | | | 257/774 |
| 2015/0329420 A1* | 11/2015 | Tatsukoshi | C03C 23/0025 |
| | | | 65/112 |
| 2016/0168006 A1* | 6/2016 | Ono | B23K 26/384 |
| | | | 65/112 |
| 2016/0279895 A1* | 9/2016 | Marjanovic | B32B 3/266 |
| 2016/0347643 A1* | 12/2016 | Yamauchi | C03C 15/00 |
| 2016/0362331 A1* | 12/2016 | Castle | C03C 23/0025 |
| 2017/0096361 A1* | 4/2017 | Horiuchi | B23K 26/073 |
| 2017/0295652 A1* | 10/2017 | Isobe | H01L 23/15 |
| 2018/0068868 A1* | 3/2018 | Jaramillo | C03C 15/00 |
| 2018/0312432 A1* | 11/2018 | Horiuchi | C03C 23/0025 |
| 2018/0317319 A1* | 11/2018 | Mori | H05K 1/115 |
| 2018/0339936 A1* | 11/2018 | Ono | C03C 15/00 |
| 2019/0021170 A1* | 1/2019 | Isobe | H05K 3/0029 |

* cited by examiner

GLASS PANEL FOR WIRING BOARD AND METHOD OF MANUFACTURING WIRING BOARD

BACKGROUND OF THE INVENTION

1. Field of the Invention

The present invention relates to a glass panel for a wiring board and a method of manufacturing a wiring board.

2. Description of the Related Art

Conventionally, a glass panel is used in a wiring board that is used for an IC package board, an interposer and the like (Patent Document 1, for example). When performing a process at a specific position on the glass panel by identifying the position, an alignment mark is used for alignment.

However, when the alignment mark is constituted by through holes, as the glass panel is transparent, there is a concern that the alignment mark cannot be recognized by a camera. Thus, a technique capable of accurately recognizing the alignment mark is desired.

PATENT DOCUMENT

[Patent Document 1] Japanese Laid-Open Patent Publication No. 2014-93406

SUMMARY OF THE INVENTION

The present invention is made in light of the above problems.

According to an embodiment, there is provided a glass panel for a wiring board including a first surface and a second surface, the second surface being opposite to the first surface; and an alignment mark constituted by a plurality of through holes each penetrating the glass panel from the first surface to the second surface, at least one of the plurality of through holes being configured such that a first diameter "t1" of a first opening at the first surface, a second diameter "t2" of a second opening at the second surface, and a minimum diameter "t3" between the first surface and the second surface satisfy t1>t3 and also t2>t3.

BRIEF DESCRIPTION OF THE DRAWINGS

Other objects, features and advantages of the present invention will become more apparent from the following detailed description when read in conjunction with the accompanying drawings.

DETAILED DESCRIPTION OF THE PREFERRED EMBODIMENTS

Figure 1:
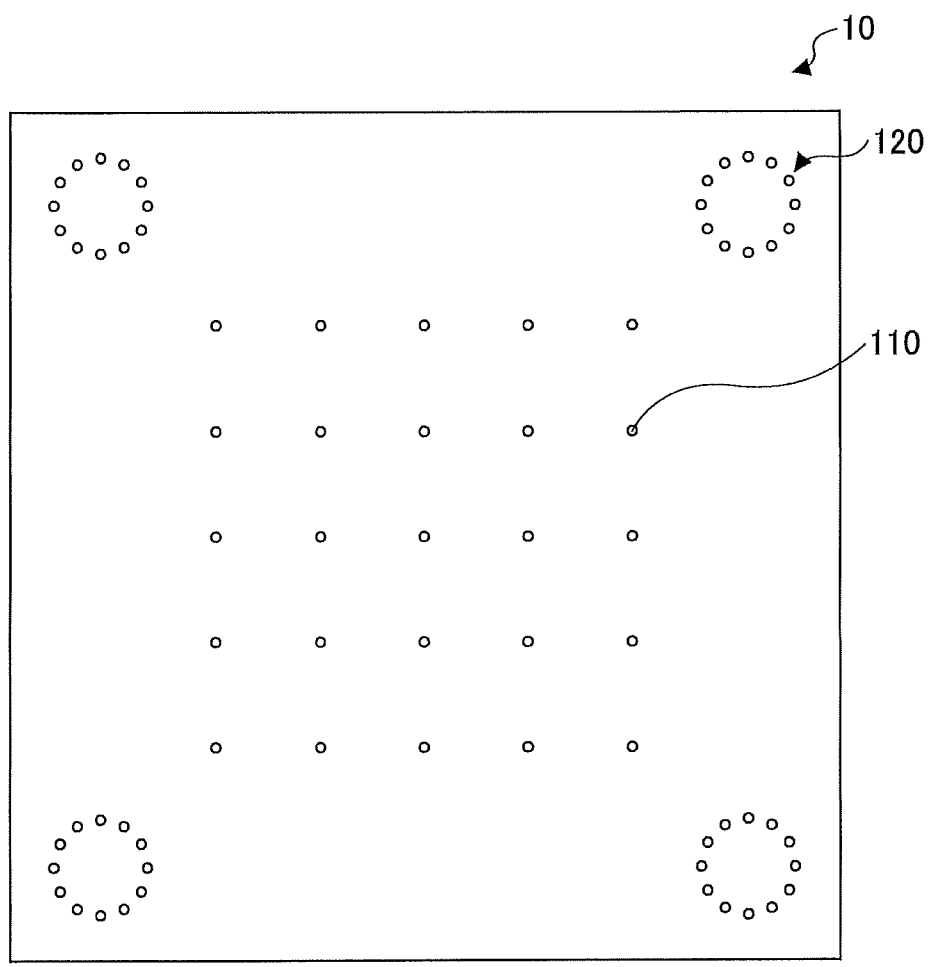
FIG. 1 is a view for describing a glass panel for a wiring board of an embodiment.

The invention will be described herein with reference to illustrative embodiments. Those skilled in the art will recognize that many alternative embodiments can be accomplished using the teachings of the present invention and that the invention is not limited to the embodiments illustrated for explanatory purposes.

It is to be noted that, in the explanation of the drawings, the same components are given the same reference numerals, and explanations are not repeated.

Embodiment (Structure of Glass Panel for Wiring Board)

Figure 2:
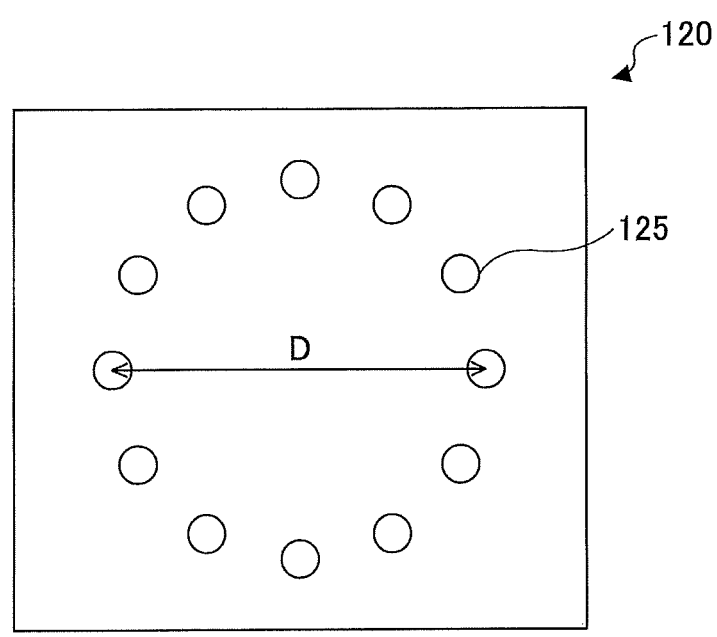
FIG. 2 is an enlarged schematic view of an alignment mark.
Figure 4:
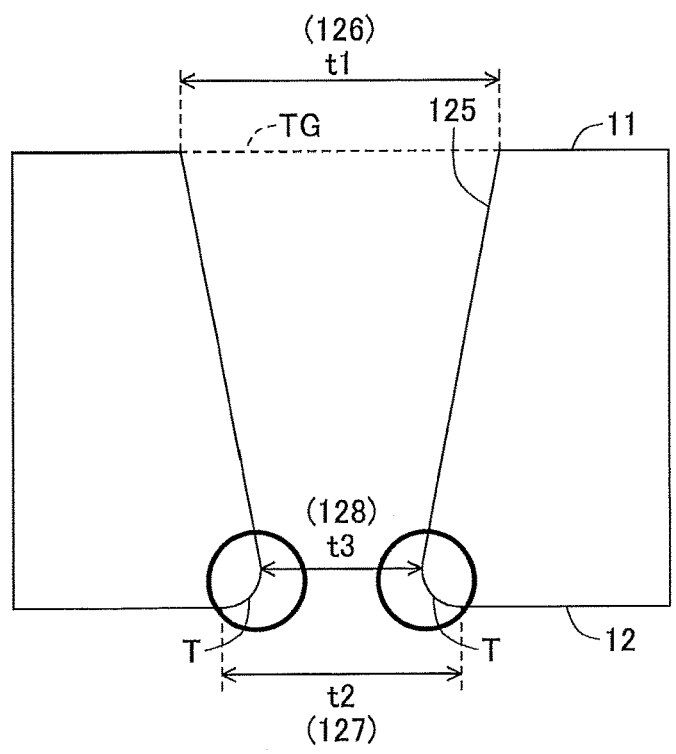
FIG. 4 is a cross-sectional view illustrating a through hole constituting the alignment mark.

FIG. 1 is a view for describing a glass panel 10 for a wiring board (hereinafter, simply referred to as "the glass panel 10") of the embodiment. FIG. 2 is an enlarged schematic view of an alignment mark 120. FIG. 4 is a cross-sectional view illustrating a through hole 125 constituting the alignment mark 120.

The glass panel 10 may be used for an IC package board, an interposer or the like, for example. As illustrated in FIG. 1, the glass panel 10 includes through holes (via holes) 110 to be filled and alignment marks 120. In this embodiment, the glass panel 10 is made of a non-alkali glass, for example. Further, in this embodiment, the glass panel 10 has a substantially square shape whose length of each side may be 300 mm, for example. However, the glass panel 10 may have any shape and any size as long as the glass panel 10 can be used as a glass panel for wiring board. The thickness of the glass panel 10 may be greater than or equal to 0.15 mm, and preferably, greater than or equal to 0.3 mm. Further, the thickness of the glass panel 10 may be less than or equal to 1 mm, and preferably, less than or equal to 0.7 mm.

Each of the through holes 110 to be filled penetrates the glass panel 10 from a front surface 11 (referred to as a "first surface" as well) to a back surface 12 (referred to as a "second surface" as well) of the glass panel 10. The back surface 12 is opposite to the front surface 11.

The through holes 110 to be filled are used for a technique called TGV (Through-Glass Via) by which the through holes 110 are filled with an electrical conductive material. Hereinafter, the through hole 110 to be filled is simply referred to as the through hole 110. In this embodiment, the plurality of through holes 110 may be provided at equal intervals.

The alignment mark 120 is a pattern provided at a specific position of the glass panel 10. In this embodiment, the alignment marks 120 may be provided at four corners of the glass panel 10, respectively. The alignment marks 120 are used for alignment of the glass panel 10.

Each of the alignment marks 120 is formed by a plurality of through holes 125 each penetrating the glass panel 10 from the front surface 11 to the back surface 12 of the glass panel 10. In this embodiment, the plurality of through holes 125 constituting each of the alignment marks 120 are provided on an outer periphery of a circle with a predetermined diameter "D". In this embodiment, the diameter "D" is greater than or equal to 1 mm, for example. By setting the diameter "D" to be greater than or equal to 1 mm, recognition accuracy of the alignment mark 120 by a camera or the like can be improved. Meanwhile, the diameter "D" may be less than or equal to 2 mm. By setting the diameter "D" to be less than or equal to 2 mm, the number of the through holes 125 necessary for constituting each of the alignment marks 120 becomes small, and a manufacturing period necessary for forming the alignment marks 120 can be reduced. Each of the through holes 110 and the through holes 125 has a substantially circular shape in a planar view.

As illustrated in FIG. 4, in this embodiment, at least one of the through holes 125 is configured such that a first diameter "t1" of a first opening 126 at the front surface 11, a second diameter "t2" of a second opening 127 at the back surface 12, and a minimum diameter "t3" between the front surface 11 and the back surface 12 satisfy t1>t3 and also t2>t3. Hereinafter, a portion of the through hole 125 at which the diameter of the through hole 125 becomes the minimum diameter "t3" is referred to as a "portion 128". It is preferable that each of the through holes 125 is configured to satisfy the above relationship.

Specifically, with reference to FIG. 4, the first diameter "t1" of the first opening 126 of the through hole 125 is defined to be equal to a length of a tangent line "TG" (a distance between two intersection points of the tangent line "TG" and the front surface 11) in a cross-section that passes a center of the through hole 125. As the alignment mark 120 includes the plurality of through holes 125 in this embodiment, the first diameter "t1" of the first opening 126 is calculated by an average value of the diameters of the plurality of through holes 125.

The second diameter "t2" of the second opening 127 at the back surface 12 of the glass panel 10 is similarly calculated. Further, a minimum diameter of the through hole 125 between the front surface 11 and the back surface 12 is defined as the minimum diameter "t3". The first diameter "t1" may be within a range of 1 to 100 μm, and preferably, greater than or equal to 10 μm and less than or equal to 75 μm. More preferably, the first diameter "t1" may be less than or equal to 70 μm, furthermore preferably, less than or equal to 60 μm, and yet furthermore preferably, less than or equal to 50 μm. The second diameter "t2" may be within a range of 1 to 100 μm, and preferably, greater than or equal to 10 μm and less than or equal to 60 μm. More preferably, the second diameter "t2" may be less than or equal to 40 μm, furthermore preferably, less than or equal to 30 μm, and yet furthermore preferably, less than or equal to 20 μm. In this embodiment, as an example, the first diameter "t1" is 75 μm, the second diameter "t2" is 60 μm and the minimum diameter "t3" is 40 μm.

It is preferable that a pitch between the through holes 125 constituting the alignment mark 120 is greater than or equal to 1.5 times whichever of the first diameter "t1" and the second diameter "t2" is the larger. With this, even when the glass panel 10 is distorted when forming the through holes 125, undesired connection of the through holes 125 can be suppressed. In other words, generation of cracking can be suppressed. In this embodiment, the pitch of the through holes 125 constituting the alignment mark 120 is 120 μm, which is greater than or equal to 1.5 times of the first diameter "t1", for example.

Further, it is preferable that the pitches of the through holes 125 constituting the alignment mark 120 are equal intervals. With this configuration, the size of the alignment mark 120 can be made smaller compared with a case when the pitches of the through holes 125 constituting the alignment mark 120 are not equal intervals.

It is preferable that the minimum diameter "t3" of the through hole 125 is greater than or equal to 10 μm, more preferably, greater than or equal to 20 μm, and furthermore preferably, greater than or equal to 30 μm.

Here, if an alignment mark is formed by a single large through hole, cracking may be generated in the glass panel 10 due to distortion of the glass panel 10 when forming such a large through hole. However, according to the alignment mark 120 of the embodiment, as the alignment mark 120 is constituted by the plurality of small through holes, compared with a case when the alignment mark is constituted by the large through hole, generation of cracking can be suppressed.

As will be described later in detail with reference to FIG. 5B, when performing a process at a specific position on the glass panel 10, the alignment marks 120 are used for alignment. As will be described later, when using the alignment marks 120 for alignment of the glass panel 10, light is irradiated to recognize each of the alignment marks 120.

According to the glass panel 10 of the embodiment, the above described relationships t1>t3 and also t2>t3 are satisfied. Thus, when the light is irradiated on the front surface 11 from a front surface 11 side, a part of the light entered in the through hole 125 is reflected by a sidewall of the through hole 125. Similarly, when the light is irradiated on the back surface 12 from a back surface 12 side, a part of the light entered in the through hole 125 is reflected by the sidewall of the through hole 125.

As a result, when checking the through hole 125 by the camera, the through hole 125 is effectively contrasted with a portion of the glass panel 10 where the through holes 125 are not formed, at both of the front surface 11 and the back surface 12. As a result, the alignment mark can be accurately recognized by a camera at both of the front surface 11 and the back surface 12.

It is preferable that a difference between the first diameter "t1" and the minimum diameter "t3", in other words, "t1-t3" is greater than or equal to 5 μm, and more preferably, greater than or equal to 10 μm. Similarly, it is preferable that a difference between the second diameter "t2" and the minimum diameter "t3", in other words, "t2-t3" is greater than or equal to 5 μm, and more preferably, greater than or equal to 10 μm. With this, a part of the light irradiated on each of the through holes 125 can reflect at the sidewall of the respective through holes 125. As a result, the alignment mark can be accurately recognized by a camera at both of the front surface 11 and the back surface 12.

In the glass panel 10 of the embodiment, the first diameter "t1" may be greater than or equal to 10 μm (t1≥10 μm), and more preferably, greater than or equal to 30 μm (t1≥30 μm). In addition, the second diameter "t2" may be greater than or equal to 10 μm (t2≥10 μm), and more preferably, greater than or equal to 30 μm (t2≥30 μm). With this configuration, when checking the through hole 125 by a camera, the through hole 125 is effectively contrasted with a portion of the glass panel 10 where the through holes 125 are not formed, at both of the front surface 11 and the back surface 12. As a result, the alignment mark 120 can be more easily recognized at both of the front surface 11 and the back surface 12.

In this embodiment, the through holes 125 constituting the alignment mark 120 are formed by following steps.

Figure 3:
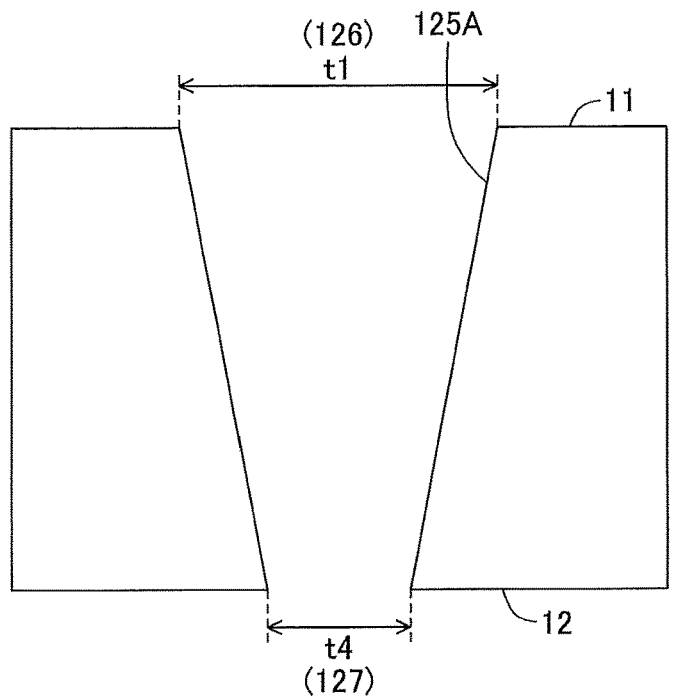
FIG. 3 is a cross-sectional view after a first step is performed.

FIG. 3 is a cross-sectional view illustrating the glass panel 10 after a first step is performed. In the first step, laser light is irradiated on the front surface 11 to form through holes 125A each penetrating the glass panel 10 from the front surface 11 to the back surface 12. The through holes 110 to be filled may be formed in the first step as well with the through holes 125A.

$CO_2$ laser may be used as the laser light in the first step. An opening diameter of each of the through holes 125A may be adjusted by a focal position of the laser light, energy of the laser light, and the like. For example, the opening diameter is increased by increasing the energy of the laser light and the like.

As illustrated in FIG. 3, at this time, the through hole 125A is configured such that the first diameter "t1" of the first opening 126 at the front surface 11 is larger than a diameter "t4" of the second opening 127 at the back surface 12. In other words, the through hole 125A is formed to be tapered such that its diameter decreases from the front surface 11 toward the back surface 12. This is because, as the laser light is irradiated from the front surface 11 side, an amount of heat received by the front surface 11 is greater than that by the back surface 12.

Next, in a second step, laser light is irradiated on the back surface 12 to increase a diameter of the second opening 127 of each of the through holes 125A at the back surface 12. $CO_2$ laser may be used as the laser light in the second step as well. As a result, the through holes 125 as illustrated in FIG. 4 are formed.

In the second step, by targeting a focal point of the $CO_2$ laser near the back surface 12 at each of the through holes 125A, a chamfer portion "T" can be formed at the respective through holes 125A near the back surface 12 of the glass panel 10, as illustrated in FIG. 4. As a result, the diameter "t4" of the second opening 127 of each of the through holes 125A becomes the second diameter "t2" (t2>t4) and the through holes 125 are formed.

By performing the second step in addition to the first step, the second diameter "t2" that is larger than the minimum diameter "t3" is formed. Thus, the through hole 125 is formed to be tapered off from the front surface 11 toward the back surface 12, which means that the diameter decreases from the front surface 11 toward the portion 128 of the through hole 125 whose diameter becomes the minimum diameter "t3", and also tapered off from the back surface 12 toward the front surface 11, which means that the diameter decreases from the back surface 12 toward the portion 128 of the through hole 125. Here, the minimum diameter "t3" may be larger than the diameter "t4" of the second opening 127 of the through hole 125A.

As described above, according to the glass panel 10 of the embodiment, the through holes 110 are formed by the laser light same as the laser light used for forming the through holes 125 (through holes 125A) of each of the alignment marks 120. Thus, the glass panel 10 can be easily manufactured.

(Method of Manufacturing Wiring Board Using Glass Panel)

Figure 5A:
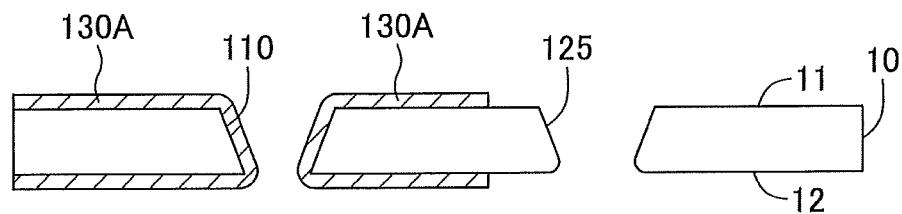
FIG. 5A to FIG. 5C are views for describing manufacturing steps of a wiring board using the glass panel.
Figure 5B:
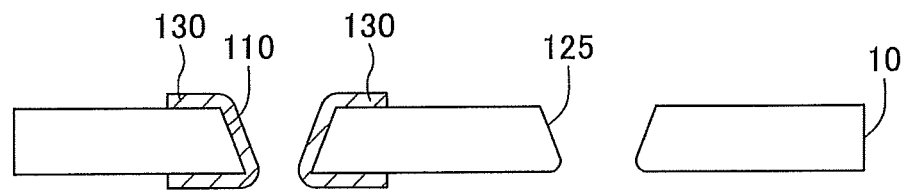
Figure 5C:
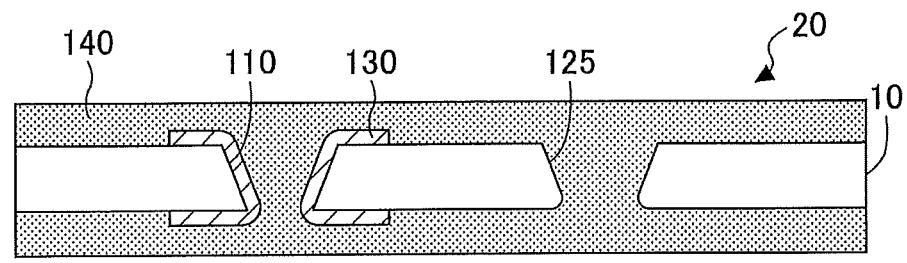

FIG. 5A to FIG. 5C are views for describing manufacturing steps of a wiring board 20 using the glass panel 10. As illustrated in FIG. 5A, the through holes 110 and the through holes 125 are formed in the glass panel 10.

A copper interconnect 130 may be formed by using either of a subtractive method and an additive method. In this embodiment, an example is described in which the subtractive method is used for forming the copper interconnect 130.

Firstly, a metal layer 130A is formed on the front surface 11 and the back surface 12 of the glass panel 10, and also over a sidewall of each of the through holes 110. The metal layer 130A may be formed by the following steps, for example. The metal layer 130A may be made of copper.

A thin copper (Cu) film is formed on the front surface 11 and the back surface 12 of the glass panel 10, and also over a sidewall of each of the through holes 110 and the through holes 125 by electroless copper (Cu) plating. Then, a copper (Cu) film is formed on the thin copper (Cu) film to increase the thickness of the copper (Cu) film by electrolytic copper (Cu) plating.

Thereafter, after covering the through holes 110 with films each having resistance against etchant, the metal layer 130A formed on and around the through holes 125 is removed by wet etching and the like to expose the alignment marks 120. FIG. 5A illustrates this state.

The metal layer 130A formed on and around the through holes 125 need not be removed. However, by removing the metal layer 130A formed on and around the through holes 125 as illustrated in FIG. 5A, positions of the through holes 125 are more clearly recognized and recognition accuracy of the alignment mark 120 by a camera is improved. Further, as described later in detail, if the metal layer 130A is left on and around the through holes 125, it is preferable that the metal layer 130A will not be discontinuous in order to facilitate recognition accuracy of the alignment mark 120 by a camera.

Next, as illustrated in FIG. 5B, by processing the metal layer 130A, a copper interconnect 130 is formed in each of the through holes 110. The copper interconnects 130 may be formed by the following steps, for example.

First, a resist layer (photoresist, not illustrated) is formed on the front surface 11 of the glass panel 10. Thereafter, positional information of the glass panel 10 is obtained by recognizing the alignment marks 120 at the front surface 11 by a camera while irradiating light, and using positional information of the alignment marks 120. Then, using the positional information of the glass panel 10, the resist layer is processed. Specifically, the resist layer is exposed and developed. Thereafter, using the resist layer as a mask, the metal layer 130A at the front surface 11 that is not covered by the mask is etched. Then, the resist layer is removed.

Then, a resist layer (photoresist, not illustrated) is formed on the back surface 12 of the glass panel 10. Thereafter, positional information of the glass panel 10 is obtained by recognizing the alignment marks 120 at the back surface 12 by a camera while irradiating light, and using positional information of the alignment marks 120. Then, using the positional information of the glass panel 10, the resist layer is processed. Specifically, the resist layer is exposed and developed. Thereafter, using the resist layer as a mask, the metal layer 130A at the back surface 12 is etched. Then, the resist layer is removed. FIG. 5B illustrates this state.

It is preferable that wavelength of the light irradiated on the alignment mark 120 for recognizing the alignment mark 120 at the front surface 11 or the back surface 12 is greater than or equal to 400 nm. With this configuration, the resist layer is not cured by the light.

Thereafter, after performing a roughing process on a surface of each of the copper interconnects 130, at either of or both of the front surface 11 and the back surface 12, an insulation resin layer 140 that covers the copper interconnects 130 are formed. With these steps, a wiring board 20 is completed. By performing the roughing process, the surfaces of the copper interconnects 130 are roughed, and adhesion between the copper interconnects 130 and the insulation resin layer 140 is increased.

FIG. 5C is a view for describing the wiring board 20 after forming the insulation resin layer 140. Further, by a so-called build-up process, a multi-layered wiring board may be manufactured. According to the method of manufacturing the wiring board 20 of the embodiment, as the alignment marks 120 are accurately recognized by the camera, at both of the front surface 11 and the back surface 12, the wiring board 20 is accurately manufactured.

Modified Examples

When forming the through holes 125 of each of the alignment marks 120 by the $CO_2$ laser, short pulse laser whose wavelength is less than or equal to 800 nm may be used. Further, in such a case, it is preferable that the pulse width is less than 1 ns, more preferably, less than or equal to 100 ps, and furthermore preferably, less than or equal to 10 ps.

Although the $CO_2$ laser is used for forming the through holes 125 of each of the alignment marks 120 in the above embodiment, this is not limited as such. Instead of the $CO_2$ laser, for example, the through holes 125 may be formed by UV-YAG laser, He:Ne laser, Ar ion laser, excimer XeF laser, Er:YAG laser, Nd:YAG laser, second high frequency of Nd:YAG laser, third high frequency of Nd:YAG laser, ruby laser, fiber laser, spark erosion, etching, sand blasting or drilling.

Although the diameter "t4" of the second opening 127 of the through hole 125A is increased by irradiating the laser light from the back surface 12 side in the above embodiment (see FIG. 3), this is not limited as such. For example, after forming the through hole 125A as described above, a film may be provided at the front surface 11 of the glass panel 10 to cover the through hole 125A at the front surface 11, and the diameter "t4" of the second opening 127 of the through hole 125A may be increased by wet etching using hydrofluoric acid or the like.

Alternatively, when forming the through holes 125A, a film of PET or the like may be formed at the back surface 12. By forming such a film, when irradiating the laser light from the front surface 11 side to form the through holes 125, the chamfer portion T may be formed at each of the through holes 125 at the back surface 12 by heat of fusion of the film.

Although the metal layer 130A is formed by, after forming the thin copper (Cu) film by the electroless copper (Cu) plating, increasing the thickness of the copper (Cu) film by the electrolytic copper (Cu) plating in the above embodiment, this is not limited as such. For example, before forming the electroless copper (Cu) plating, an adhesion layer made of titanium (Ti), tin (Sn), zinc (Zn) or the like may be formed. Further, instead of using the electroless copper (Cu) plating, the thin copper (Cu) film may be formed by sputtering copper (Cu) on an adhesion layer made of titanium (Ti), nickel (Ni), chromium (Cr) or the like.

Although the copper interconnect 130 is formed as a conformal via, in which the metal layer is formed on the sidewall of each of the through holes 110 but does not fill each of the through holes 110, in each of the through holes 110 in the above embodiment, the copper interconnect 130 may be formed to completely fill each of the through holes 110 without a space.

Further, the second step as described above with reference to FIG. 4 need not be performed for the through holes 110 to be filled. Alternatively, the second step may be performed for the through holes 110 to be filled similarly as for the through holes 125. Furthermore alternatively, the through holes 110 to be filled may be separately formed from the through holes 125.

Although the resist layer is formed on each of the front surface 11 and the back surface 12 of the glass panel 10 in manufacturing the wiring board 20 in the above embodiment, this is not limited as such. The resist layer may be formed on either of the front surface 11 and the back surface 12 of the glass panel 10.

Although each of the alignment marks 120 is constituted by the plurality of through holes 125 in the above embodiment, this is not limited as such. Each of the alignment marks 120 may be formed by holes that do not penetrate the glass panel 10, for example.

Although the through holes 125 constituting the alignment mark 120 are provided on the outer periphery of the circle in the above embodiment, this is not limited as such. For example, the through holes 125 constituting the alignment mark 120 may be provided along an outer periphery of a rectangular or square shape.

The alignment mark 120 may have various configurations.

For example, the plurality of through holes 125 constituting the alignment mark 125 may be provided on an outer periphery of a certain graphic pattern, or on the outer periphery of the certain graphic pattern and also within the certain graphic pattern.

Figure 6A:
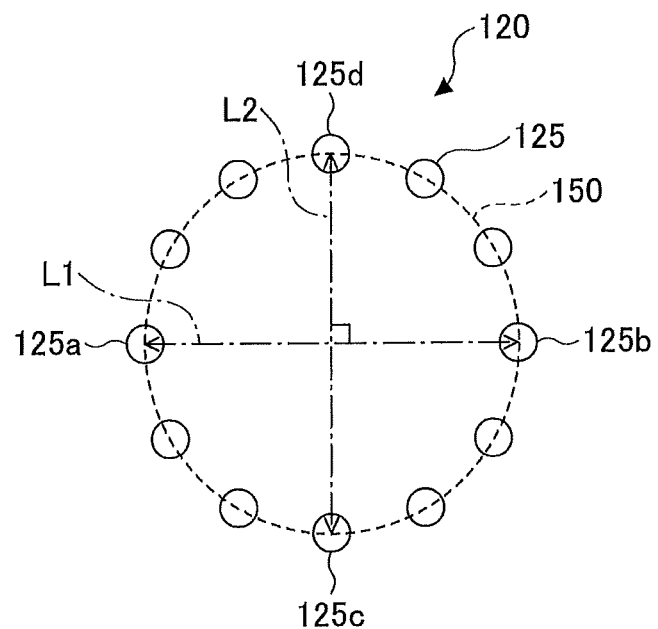
FIG. 6A and FIG. 6B are views each illustrating an example of the alignment mark.

FIG. 6A is a view illustrating an example of the alignment mark 120 seen from the front surface 11, and illustrates a case where the certain graphic pattern is a circle 150. The through holes 125 are provided on the outer periphery of the circle 150. Here, the through holes 125 provided on the outer periphery of the circle 150 include a first through hole 125a and a second through hole 125b. A distance between centers of the first openings of the first through hole 125a and the second through hole 125b may be greater than or equal to 1 mm.

In other words, in each of the alignment marks 120, the plurality of through holes 125 provided on the outer periphery of the certain graphic pattern (circle 150, for example) may be configured such that the maximum length "$d_{max}$" of a length "d" of a straight line connecting centers of first openings of any two of the through holes 125 at the front surface 11 is greater than or equal to 1 mm.

Furthermore, the through holes 125 provided on the outer periphery of the circle 150 further include a third through hole 125c and a fourth through hole 125d. Provided that the first through hole 125a and the second through hole 125b are provided on a first straight line "L1", the third through hole 125c and the fourth through hole 125d are provided on a second straight line "L2" that is perpendicular to the first straight line "L1" and also that passes through a midpoint between the first through hole 125a and the second through hole 125b on the first straight line "L1". Accordingly, in each of the alignment marks 120, a distance between centers of the first openings of the third through hole 125c and the fourth through hole 125d at the front surface 11 may be greater than or equal to 1 mm.

In other words, in each of the alignment marks 120, a length "$d_{dg1}$" of a second line segment (L2) that passes through a midpoint of a first line segment (L1) connecting the two through holes whose distance takes the maximum length "$d_{max}$" and that is perpendicular to the first line segment (L1) is greater than or equal to 1 mm.

Although not specifically limited, each of the distance between the centers of the first openings of the first through hole 125a and the second through hole 125b, and the distance between the centers of the first openings of the third through hole 125c and the second through hole 125d, may be less than or equal to 2 mm.

Figure 6B:
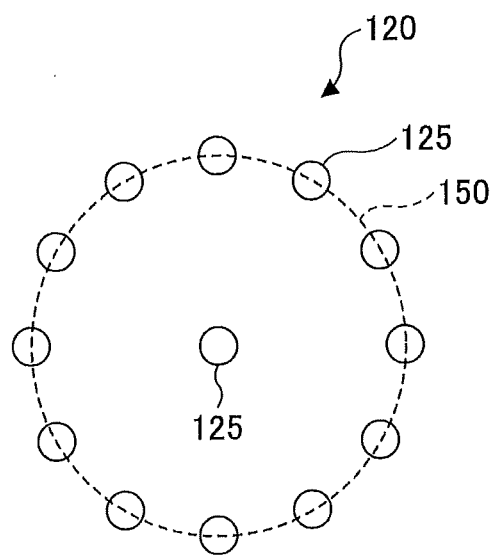

FIG. 6B is a view illustrating another example of the alignment mark 120 seen from the front surface 11, and illustrates a case where the certain graphic pattern is a circle 150. In the alignment mark 120 of FIG. 6B, the through hole 125 is provided within the circle 150 in addition to the through holes 125 provided on the outer periphery of the circle 150.

Figure 7A:
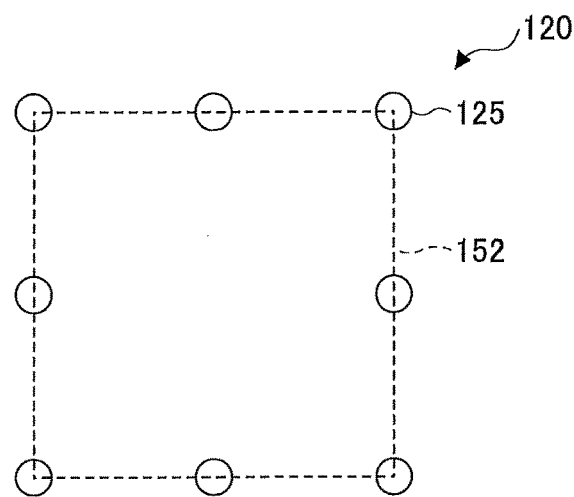
FIG. 7A to FIG. 7C are views each illustrating an example of the alignment mark.
Figure 7B:
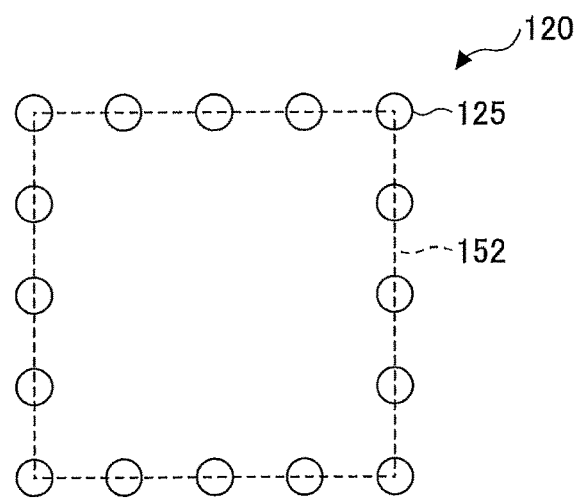
Figure 7C:
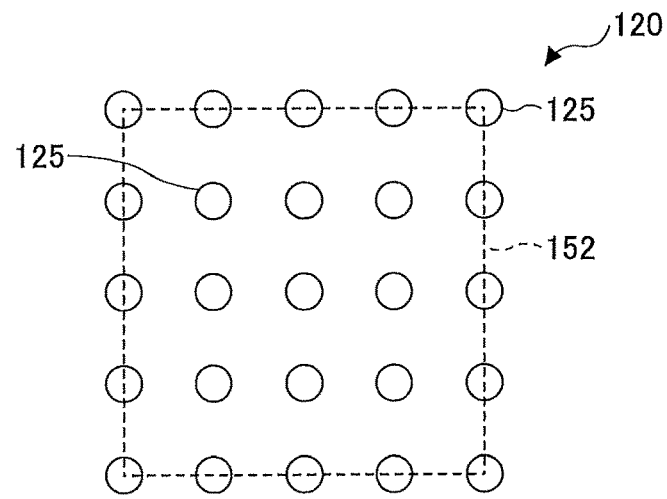

FIG. 7A to FIG. 7C are views each illustrating another example of the alignment mark 120 seen from the front surface 11, and illustrates a case where the certain graphic pattern is a square shape 152. FIG. 7A and FIG. 7B each illustrate the alignment mark 120 in which the through holes 125 are provided on the outer periphery of the square shape 152. In the alignment mark 120 of FIG. 7C, the through hole 125 is provided within the square shape 152 in addition to the through holes 125 provided on the outer periphery of the square shape 152.

It is preferable that each of the alignment marks 120 is constituted by eight or more of the through holes 125. With this configuration an error in recognition of the alignment mark 120 can be reduced.

Furthermore, the certain graphic pattern may have various shapes such as a cross shape, in addition to the circle and the rectangular or square shape.

The glass panel 10 may have various configurations, and the alignment marks 120 may be provided on the glass panel 10 in various ways.

Figure 8A:
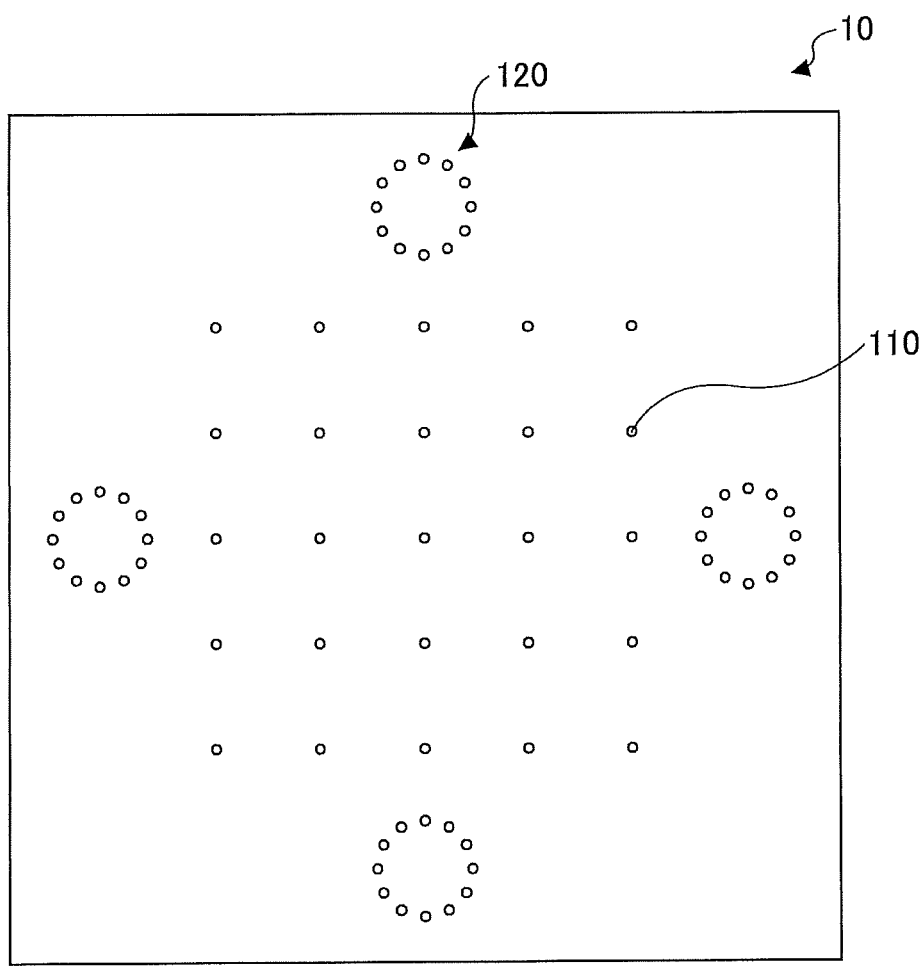
FIG. 8A and FIG. 8B are views each illustrating an arrangement pattern of the alignment marks.

For example, the glass panel 10 may have a substantially rectangular or square shape having four corners and four sides in a planar view. At this time, the alignment mark 120 may be provided at least at each of two corners among the four corners of the glass panel 10. FIG. 1 illustrates an example in which the alignment mark 120 is provided at each of the four corners of the glass panel 10. Alternatively, the alignment mark 120 may be provided at least along each of two sides among the four sides of the glass panel 10. FIG. 8A illustrates an example in which the alignment mark 120 is provided at each of the four sides of the glass panel 10.

As alignment accuracy is improved when a distance between the alignment marks 120 is long, it is preferable to provide the alignment marks 120 along an outer periphery of the glass panel 10 such as the corners or the sides. It is preferable to provide three of the alignment marks 120, and more preferably, four or more of the alignment marks 120 may be provided.

Figure 8B:
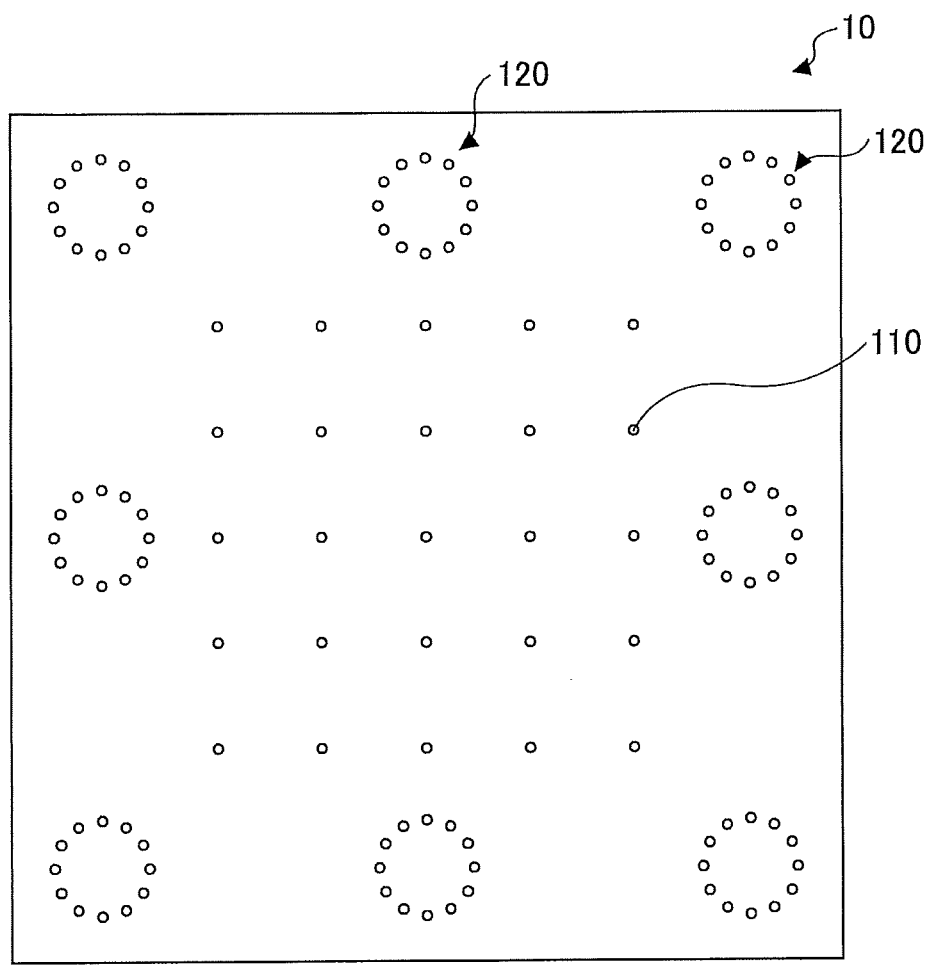

FIG. 8B illustrates an example in which the alignment mark 120 is provided at each of the four corners and each of the four sides of the glass panel 10.

Furthermore, the alignment mark 120 may be further provided substantially at a center of the glass panel 10. With this configuration, even when the glass panel 10 is large, the alignment mark 120 can be included in a screen taken by a camera.

Figure 9A:
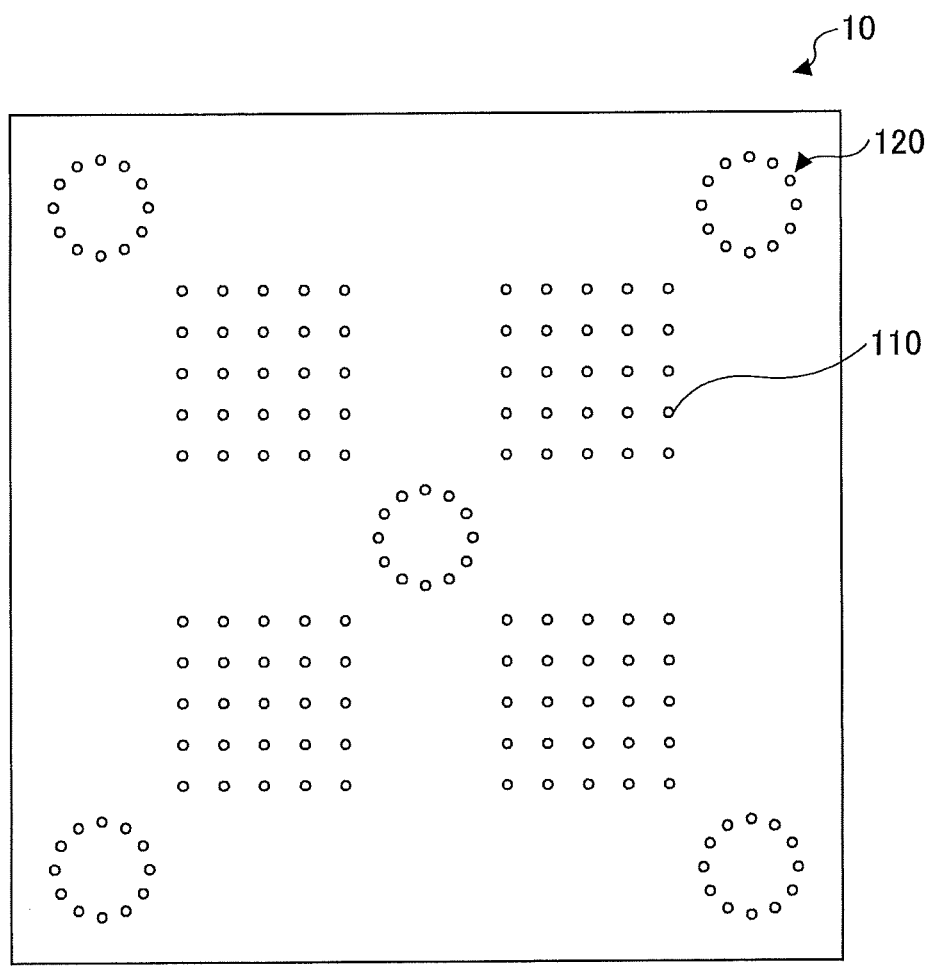
FIG. 9A and FIG. 9B are views each illustrating an arrangement pattern of the alignment marks.
Figure 9B:
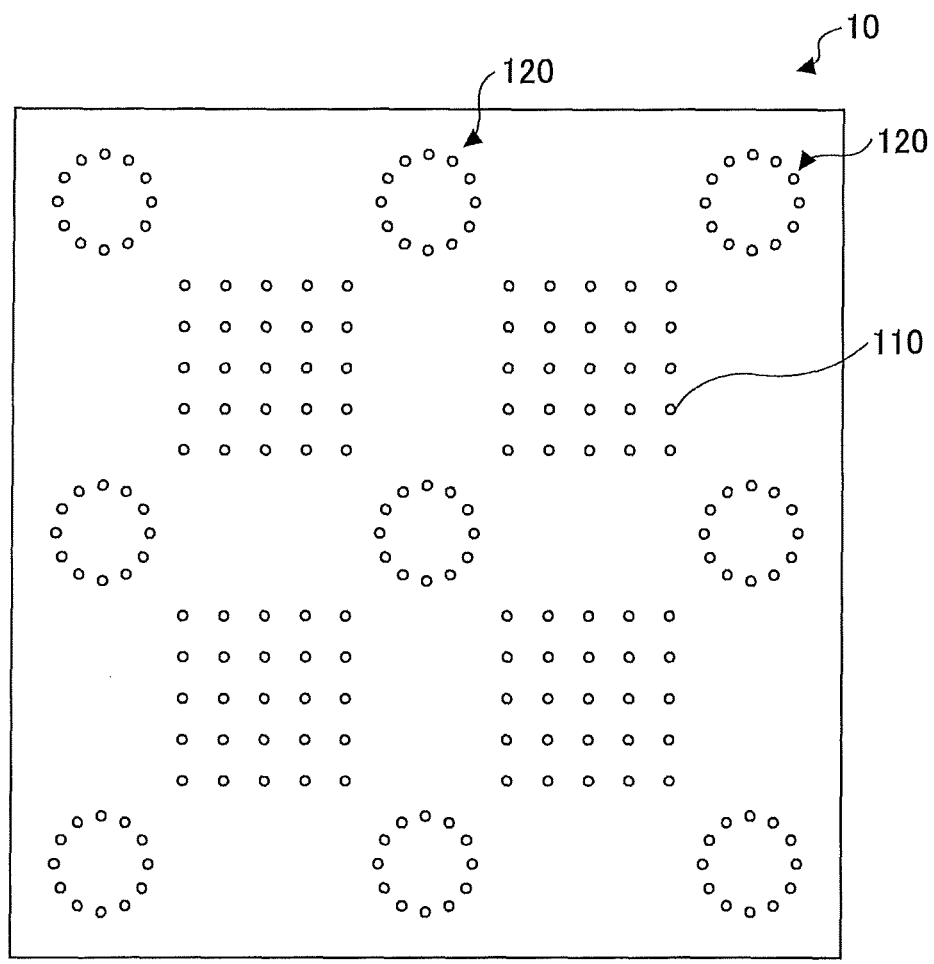

FIG. 9A illustrates an example in which the alignment mark 120 is provided at a center in addition to each of the four corners of the glass panel 10. FIG. 9B illustrates an example in which the alignment mark 120 is provided at the center in addition to each of the four corners and each of the four sides of the glass panel 10.

Furthermore, although not illustrated, the glass panel 10 may have a circular shape such as a wafer. In such a case as well, the alignment marks 120 may be provided along the outer periphery of the glass panel 10, at four positions, for example.

Furthermore, a distance between an outer edge of the glass panel 10 and the through hole 125 constituting the alignment mark 120 that is nearest to the outer edge of the glass panel 10 may be greater than or equal to 1 mm, and more preferably, may be greater than or equal to 5 mm. With this configuration, cracking and chipping of the glass panel 10 can be prevented.

Figure 10:
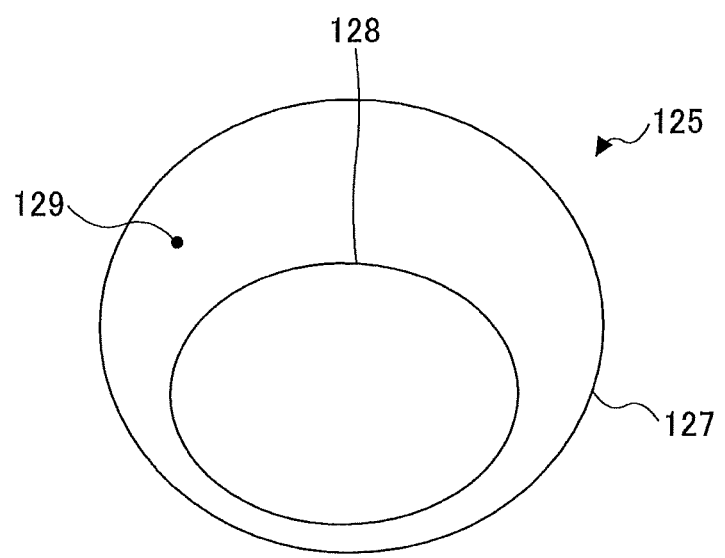
FIG. 10 is a schematic view illustrating the configuration of a second opening of the through hole.

As illustrated in FIG. 4, in the at least one of the through holes 125, an inner wall surface is a substantially curved surface from the portion 128 of the through hole 125 whose diameter becomes the minimum diameter "t3" to the back surface 12. FIG. 10 specifically illustrates this feature of the through hole 125. An inner surface 129 of the through hole 125 is curved from the portion 128 to the second opening 127.

With this configuration, when the light is irradiated to recognize each of the alignment marks 120, the light is reflected at the curved surface and an edge of the through hole 125 is easily recognized. Furthermore, as stress can be dispersed, the glass panel 10 will not break.

Further, when a thin metal film such as the metal layer 130A is formed on the inner surface of the through hole 125, it is preferable that the thin metal film will not be discontinuous. Furthermore, even when the conductive material is not filled in the through hole 125, if the thin metal film is evenly deposited on the curved inner surface 129 of the through hole 125, the light is easily reflected by the inner surface. Thus, an edge of the through hole 125 can be easily recognized.

Furthermore, as illustrated in FIG. 4, the portion 128 of the through hole 125 whose diameter becomes the minimum diameter "t3" may be positioned between a center of the glass panel 10 in its thickness direction and the back surface 12.

Furthermore, a distance between the portion 128 of the through hole 125 whose diameter becomes the minimum diameter "t3" and the back surface 12 may be less than or equal to 50 μm, preferably, less than or equal to 30 μm, more preferably, less than or equal to 20, furthermore preferably, less than or equal to 10, and yet furthermore preferably, less than or equal to 5.

Furthermore, the first diameter "t1" of the first opening 126 is larger than the second diameter "t2" of the second opening 127.

As long as the above described relationships t1>t3 and also t2>t3 are satisfied, the through hole 125 may have various shapes, in addition to the structure specifically illustrated in FIG. 4 and the like. Furthermore, as long as the through hole 125 is formed to be tapered off from the front surface 11 such that its diameter decreases from the front surface 11 toward the portion 128 of the through hole 125 whose diameter becomes the minimum diameter "t3", and also tapered at the back surface 12 side such that its diameter decreases from the back surface 12 toward the portion 128 of the through hole 125, the through hole 125 may have various shapes.

For example, the through holes 125 may be formed by irradiating laser on the front surface 11 of the glass panel 10 to form through holes and/or modified regions at positions at which the through holes 125 are to be formed, and then performing wet etching using hydrofluoric acid or the like from both of the front surface 11 side and the back surface 12 side.

Further, a difference between the first diameter "t1" of the first opening 126 of the through hole 125 constituting the alignment mark 120 and a diameter of an opening of each of the through holes 110 to be filled at the front surface 11 may be within 15 μm, preferably, within 15 μm, and more preferably, within 5 μm. The through holes 125 each constituting the alignment mark 120 and the through holes 110 to be filled may be formed by the same laser irradiation condition from the front surface 11 side. With this configuration, as the through holes 125 and the through holes 110 are formed by the same program, the through holes 125 and the through holes 110 can be easily formed by a short period.

Although irradiating the laser light from the back surface 12 in the second step is not performed on the through holes 110 in the above embodiment, the laser light such as the $CO_2$ laser may be irradiated on the through holes 110 from the back surface as well. With this configuration, a conductive material is easily filled in each of the through holes 110.

Various aspects of the subject-matter described herein are set out non-exhaustively in the following numbered clauses:

1. A glass panel for a wiring board, comprising:

a first surface and a second surface, the second surface being opposite to the first surface; and an alignment mark constituted by a plurality of through holes each penetrating the glass panel from the first surface to the second surface, at least one of the plurality of through holes being configured such that a first diameter "t1" of a first opening at the first surface, a second diameter "t2" of a second opening at the second surface, and a minimum diameter "t3" between the first surface and the second surface satisfy t1>t3 and also t2>t3.

With this configuration, the alignment mark can be accurately recognized.

2. In the above described glass panel for the wiring board, the plurality of through holes constituting the alignment mark may be provided on an outer periphery of a certain graphic pattern with a diameter greater than or equal to 1 mm. With this configuration, the alignment mark can be furthermore accurately recognized.

3. In the above described glass panel for the wiring board, both of the first diameter "t1" of the first opening and the second diameter "t2" of the second opening may be greater than or equal to 10 μm. With this configuration, the alignment mark can be furthermore accurately recognized.

4. A method of manufacturing a wiring board, including:

forming a resist layer on at least one of the first surface and the second surface of the above described glass panel for the wiring board; and processing the resist layer by using positional information of the alignment mark. With this configuration, the alignment mark can be accurately recognized. As a result, the wiring board can be accurately manufactured.

Although a preferred embodiment of the glass panel for a wiring board and the method of manufacturing a wiring board has been specifically illustrated and described, it is to be understood that minor modifications may be made therein without departing from the spirit and scope of the invention as defined by the claims.

The present invention is not limited to the specifically disclosed embodiments, and numerous variations and modifications may be made without departing from the spirit and scope of the present invention.

What is claimed is:

1. A glass panel for a wiring board, comprising:
a first surface and a second surface, the second surface being opposite to the first surface; and
an alignment mark constituted by a plurality of through holes each penetrating the glass panel from the first surface to the second surface,
at least one of the plurality of through holes being configured such that a first diameter "t1" of a first opening at the first surface, a second diameter "t2" of a second opening at the second surface, and a minimum diameter "t3" between the first surface and the second surface satisfy t1>t3 and also t2>t3,
wherein the plurality of through holes constituting the alignment mark are provided on an outer periphery of a certain graphic pattern, or on the outer periphery of the certain graphic pattern and also within the certain graphic pattern,
wherein the plurality of through holes provided on the outer periphery of the certain graphic pattern include a first through hole and a second through hole,
wherein a distance between centers of the first openings of the first through hole and the second through hole at the first surface is greater than or equal to 1 mm
wherein the first through hole and the second through hole are provided on a first straight line,
wherein the plurality of through holes provided on the outer periphery of the certain graphic pattern further include a third through hole and a fourth through hole that are provided on a second straight line that is perpendicular to the first straight line and also that passes through a midpoint between the first through hole and the second through hole on the first straight line, and
wherein a distance between centers of the first openings of the third through hole and the fourth through hole at the first surface is greater than or equal to 1 mm.

2. The glass panel for the wiring board according to claim 1, wherein in the at least one of the through holes, an inner wall surface is a substantially curved surface from a portion of the corresponding through hole whose diameter becomes the minimum diameter "t3" to the second surface.

3. The glass panel for the wiring board according to claim 1, wherein both of the first diameter "t1" of the first opening and the second diameter "t2" of the second opening are greater than or equal to 10 μm.

4. The glass panel for the wiring board according to claim 1, wherein a difference between the second diameter "t2" of the second opening and the minimum diameter "t3" is greater than or equal to 5 μm.

5. The glass panel for the wiring board according to claim 1, wherein the alignment mark is constituted by eight or more of the through holes.

6. The glass panel for the wiring board according to claim 1, further comprising:
a plurality of through holes to be filled each penetrating the glass panel from the first surface to the second surface, the plurality of through holes to be filled being different from the plurality of through holes constituting the alignment mark.

7. The glass panel for the wiring board according to claim 6, wherein a difference between the first diameter "t1" of the first opening of the through hole constituting the alignment mark and a diameter of an opening of each of the through holes to be filled at the first surface is within 15 μm.

8. The glass panel for the wiring board according to claim 1,
wherein the glass panel has a substantially rectangular or square shape having four corners in a planar view, and
wherein the alignment mark is provided at least at each of two corners among the four corners of the glass panel.

9. The glass panel for the wiring board according to claim 8, wherein the alignment mark is further provided substantially at a center of the glass panel.

10. The glass panel for the wiring board according to claim 1,
wherein the glass panel has a substantially rectangular or square shape having four sides in a planar view, and
wherein the alignment mark is provided at least along each of two sides among the four sides of the glass panel.

11. The glass panel for the wiring board according to claim 10, wherein the alignment mark is further provided substantially at a center of the glass panel.

12. The glass panel for the wiring board according to claim 1, wherein a distance between an outer edge of the glass panel for the wiring board and the through hole constituting the alignment mark that is nearest to the outer edge of the glass panel for the wiring board is greater than or equal to 1 mm.

13. The glass panel for the wiring board according to claim 1, wherein a portion of the through hole whose diameter becomes the minimum diameter "t3" is positioned between a center of the glass panel in its thickness direction and the second surface.

14. The glass panel for the wiring board according to claim 1, wherein a distance between a portion of the through hole whose diameter becomes the minimum diameter "t3" and the second surface in the thickness direction of the glass panel is less than or equal to 50 μm.

15. The glass panel for the wiring board according to claim 1, wherein the first diameter "t1" of the first opening is larger than the second diameter "t2" of the second opening.

16. A method of manufacturing a wiring board, comprising:
forming a resist layer on at least one of a first surface and a second surface of a glass panel for a wiring board, wherein the second surface is opposite to the first surface and the glass panel comprises an alignment mark constituted by a plurality of through holes each penetrating the glass panel from the first surface to the second surface,
at least one of the plurality of through holes being configured such that a first diameter "t1" of a first opening at the first surface, a second diameter "t2" of a second opening at the second surface, and a minimum diameter "t3" between the first surface and the second surface satisfy t1>t3 and also t2>t3; and
processing the resist layer by using, the alignment mark as positional information, wherein in the forming the resist layer, the resist layer is formed on the second surface of the glass panel, and
wherein in the processing the resist layer, the alignment mark is recognized and used as positional information by irradiating light whose wavelength is greater than or equal to 400 nm on the alignment mark such that the light is reflected at an inner wall surface of the at least one of the through holes from a portion whose diameter becomes the minimum diameter "t3" of the at least one of the through holes, to the second surface.

17. A glass panel for a wiring board, comprising
a first surface and a second surface, the second surface being opposite to the first surface;
an alignment mark constituted by a plurality of through holes each penetrating the glass panel from the first surface to the second surface, and
a plurality of through holes to be filled each penetrating the glass panel from the first surface to the second surface, the plurality of through holes to be filled being different from the plurality of through holes constituting the alignment mark,
wherein at least one of the plurality of through holes being configured such that a first diameter "t1" of a first opening at the first surface, a second diameter "t2" of a second opening at the second surface, and a minimum diameter "t3" between the first surface and the second surface satisfy t1>t3 and also t2>t3, and
wherein a difference between the first diameter "t1" of the first opening of the through hole constituting the alignment mark and a diameter of an opening of each of the through holes to be filled at the first surface is within 15 μm.

18. The glass panel for the wiring board according to claim 17, wherein in the at least one of the through holes, an inner wall surface is a substantially curved surface from a portion of the corresponding through hole whose diameter becomes the minimum diameter "t3" to the second surface.

19. The glass panel for the wiring board according to claim 17, wherein both of the first diameter "t1" of the first opening and the second diameter "t2" of the second opening are greater than or equal to 10 μm.

20. The glass panel for the wiring board according to claim 17, wherein a difference between the second diameter "t2" of the second opening and the minimum diameter "t3" is greater than or equal to 5 μm.

21. The glass panel for the wiring board according to claim 17,
wherein the plurality of through holes constituting the alignment mark are provided on an outer periphery of a certain graphic pattern, or on the outer periphery of the certain graphic pattern and also within the certain graphic pattern,
wherein the plurality of through holes provided on the outer periphery of the certain graphic pattern include a first through hole and a second through hole, and
wherein a distance between centers of the first openings of the first through hole and the second through hole at the first surface is greater than or equal to 1 mm.

22. The glass panel for the wiring board according to claim 21,
wherein the first through hole and the second through hole are provided on a first straight line, and
wherein the plurality of through holes provided on the outer periphery of the certain graphic pattern further include a third through hole and a fourth through hole that are provided on a second straight line that is perpendicular to the first straight line and also that passes through a midpoint between the first through hole and the second through hole on the first straight line, and
wherein a distance between centers of the first openings of the third through hole and the fourth through hole at the first surface is greater than or equal to 1 mm.

23. The glass panel for the wiring board according to claim 17, wherein the plurality of through holes constituting the alignment mark are provided on an outer periphery of a circle with a diameter greater than or equal to 1 mm.

24. The glass panel for the wiring board according to claim 17, wherein the alignment mark is constituted by eight or more of the through holes.

25. The glass panel for the wiring board according to claim 17,
wherein the glass panel has a substantially rectangular or square shape having four corners in a planar view, and
wherein the alignment mark is provided at least at each of two corners among the four corners of the glass panel.

26. The glass panel for the wiring board according to claim 17,
wherein the glass panel has a substantially rectangular or square shape having four sides in a planar view, and
wherein the alignment mark is provided at least along each of two sides among the four sides of the glass panel.

27. The glass panel for the wiring board according to claim 25, wherein the alignment mark is further provided substantially at a center of the glass panel.

28. The glass panel for the wiring board according to claim 26, wherein the alignment mark is further provided substantially at a center of the glass panel.

29. The glass panel for the wiring board according to claim 17, wherein a distance between an outer edge of the glass panel for the wiring board and the through hole constituting the alignment mark that is nearest to the outer edge of the glass panel for the wiring board is greater than or equal to 1 mm.

30. The glass panel for the wiring board according to claim 17, wherein a portion of the through hole whose diameter becomes the minimum diameter "t3" is positioned between a center of the glass panel in its thickness direction and the second surface.

31. The glass panel for the wiring board according to claim 17, wherein a distance between a portion of the through hole whose diameter becomes the minimum diameter "t3" and the second surface in the thickness direction of the glass panel is less than or equal to 50 μm.

32. The glass panel for the wiring board according to claim 17, wherein the first diameter "t1" of the first opening is larger than the second diameter "t2" of the second opening.

* * * * *